US012660292B2

(12) United States Patent
Lee et al.

(10) Patent No.: US 12,660,292 B2
(45) Date of Patent: Jun. 16, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Hsin-Yi Lee, Hsinchu City (TW); Cheng-Lung Hung, Hsinchu City (TW); Weng Chang, Hsin-Chu (TW); Chi-On Chui, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/597,952

(22) Filed: Mar. 7, 2024

(65) Prior Publication Data

US 2024/0234534 A1     Jul. 11, 2024

Related U.S. Application Data

(60) Continuation of application No. 17/963,196, filed on Oct. 11, 2022, now Pat. No. 11,955,528, which is a division of application No. 16/741,767, filed on Jan. 14, 2020, now Pat. No. 11,489,059.

(51) Int. Cl.
| | |
|---|---|
| *H10D 64/66* | (2025.01) |
| *H10D 30/01* | (2025.01) |
| *H10D 30/62* | (2025.01) |
| *H10D 62/10* | (2025.01) |
| *H10D 64/01* | (2025.01) |
| *H10D 64/68* | (2025.01) |
| *H10D 84/01* | (2026.01) |
| *H10D 84/03* | (2025.01) |

(Continued)

(52) U.S. Cl.
CPC ......... *H10D 64/667* (2025.01); *H10D 30/024* (2025.01); *H10D 30/6211* (2025.01); *H10D 62/119* (2025.01); *H10D 64/01318* (2026.01); *H10D 64/017* (2025.01); *H10D 84/0177* (2025.01); *H10D 84/0193* (2025.01); *H10D 84/038* (2025.01); *H10D 84/853* (2025.01); *H10P 14/418* (2026.01); *H10D 64/691* (2025.01)

(58) Field of Classification Search
CPC ............. H10D 64/667; H10D 30/6211; H10D 64/017; H10D 84/853; H10D 30/024; H10D 62/119; H10D 84/038; H10D 84/0177; H10D 84/0193
See application file for complete search history.

(56) References Cited

U.S. PATENT DOCUMENTS

| | | | | |
|---|---|---|---|---|
| 10,049,940 B1 * | 8/2018 | Chen | .................... | H10D 64/685 |
| 2019/0081152 A1 * | 3/2019 | Suh | ..................... | H10D 62/121 |
| 2019/0252259 A1 * | 8/2019 | Lu | ........................ | H10D 84/014 |

(Continued)

*Primary Examiner* — Christine A Enad
(74) *Attorney, Agent, or Firm* — JCIPRNET

(57) ABSTRACT

Semiconductor devices, FinFET devices and methods of forming the same are disclosed. One of the semiconductor devices includes a substrate and a gate strip disposed over the substrate. The gate strip includes a high-k layer disposed over the substrate, an N-type work function metal layer disposed over the high-k layer, and a barrier layer disposed over the N-type work function metal layer. The barrier layer includes at least one first film containing TiAlN, TaAlN or AlN.

20 Claims, 9 Drawing Sheets

(51) Int. Cl.
      *H10D 84/85*          (2025.01)
      *H10P 14/40*          (2026.01)

(56)                    References Cited

U.S. PATENT DOCUMENTS

2019/0311953  A1 *   10/2019   Cho  ..................... H10D 84/014
2020/0266218  A1 *    8/2020   Lilak  ................... H10D 30/014

* cited by examiner

SEMICONDUCTOR DEVICE AND METHOD OF FORMING THE SAME

CROSS-REFERENCE

This application is a continuation application of and claims the priority benefit of a prior application Ser. No. 17/963,196, filed on Oct. 11, 2022. The prior application Ser. No. 17/963,196 is a divisional application of and claims the priority benefit of a prior application Ser. No. 16/741,767, filed on Jan. 14, 2020. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
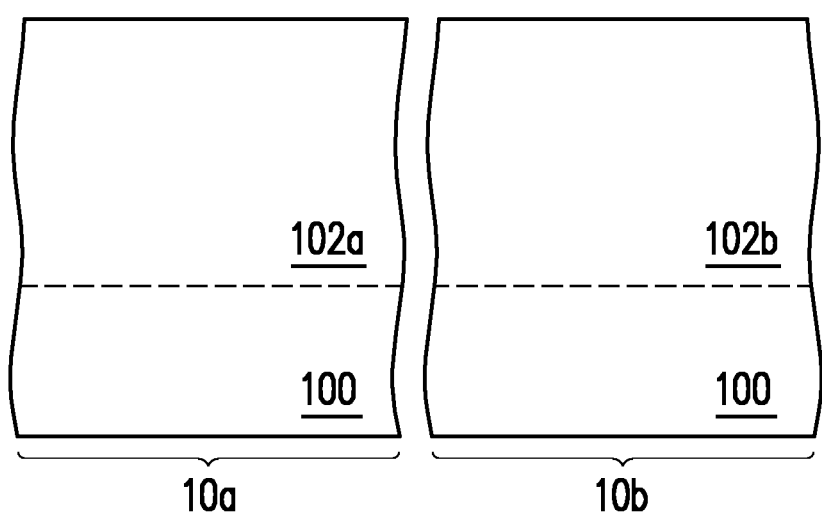
FIG. 1A to FIG. 1G are cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of forming a FinFET device in accordance with some embodiments.

Referring to FIG. 1A, a substrate 100 is provided. In some embodiments, the substrate 100 has at least one first fin 102a in a first region 10a and at least one second fin 102b in a second region 10b. The first and second fins 102a and 102b may be arranged in parallel and extend in a direction. In some embodiments, the substrate 100 includes a silicon substrate, a silicon-on-insulator (SOI) substrate, a silicon germanium substrate, or a suitable semiconductor substrate. Other semiconductor materials including group III, group IV, and group V elements may also be used. In some embodiments, the first region 10a and the second region 10b are adjacent to each other. In some embodiments, the first region 10a is an N-type device region configured for an N-type FinFET device, and the second region 10b is a P-type device region configured for a P-type FinFET device. Depending on the requirements of design, the substrate 100 may have doped regions therein. The doped regions may be configured for an N-type FinFET device or a P-type FinFET device.

The first and second fins 102a and 102b may protrude upwardly from the surface of the substrate 100. In some embodiments, the first and second fins 102a and 102b have inclined sidewalls. In alternative embodiments, at least one of the first and second fins 102a and 102b have substantially vertical sidewalls. In some embodiments, the substrate 100 has an isolation layer (not shown) formed thereon. Specifically, the isolation layer covers the lower portions while exposes the upper portions of the first and second fins 102a and 102b. In some embodiments, the isolation layer is a shallow trench isolation (STI) structure.

In some embodiments, the first and second fins 102a and 102b and the substrate 100 are made of the same material, such as silicon. In alternative embodiments, one of the first and second fins 102a and 102b includes a material different from that of the substrate 100. For example, the second fin 102b includes silicon germanium and the substrate 100 includes silicon.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
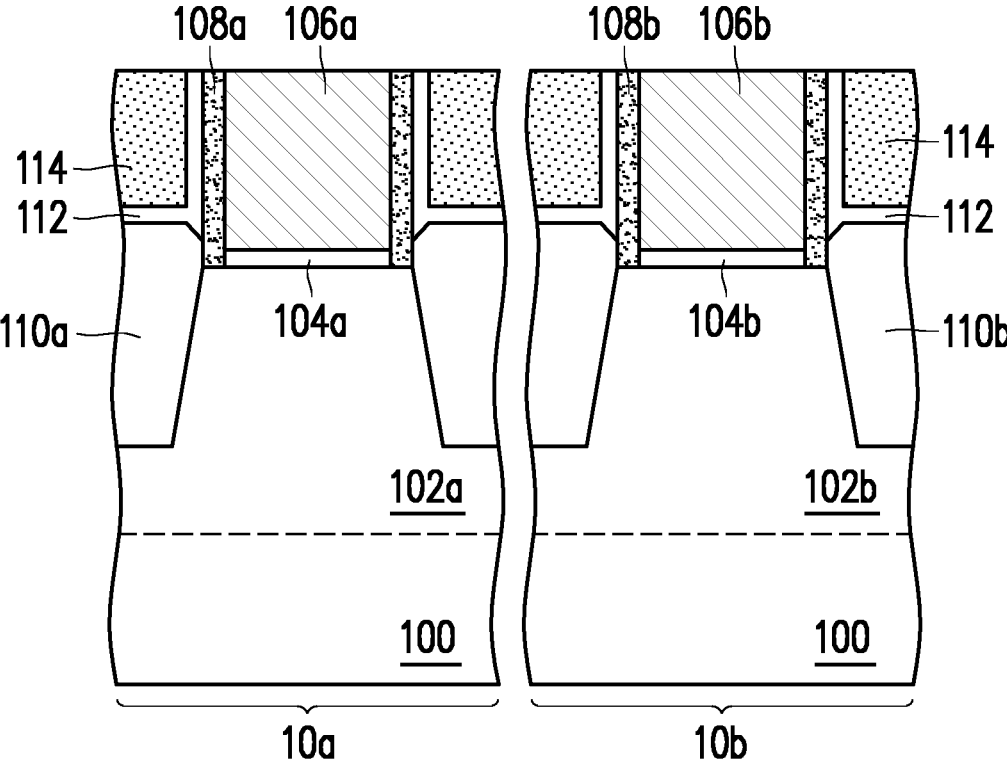

Referring to FIG. 1B, a first dummy gate strip 106a is formed across the first fin 102a, first spacers 108a are formed on sidewalls of the first dummy gate strip 106a, and first strained layers 110a are formed in the first fin 102a beside the first dummy gate strip 106a. Similarly, a second dummy gate strip 106b is formed across the second fin 102b, second spacers 108b are formed on sidewalls of the second dummy gate strip 106b, and second strained layers 110b are formed in the second fin 102b beside the second dummy gate strip 106b.

In some embodiments, the first and second fins 102a and 102b extend in a first direction, and the first and second dummy gate strips 106a and 106b extend in a second direction different from (e.g., perpendicular to) the first direction. In some embodiments, the first and second dummy gate strips 106a and 106b include a silicon-containing material, such as polysilicon, amorphous silicon or a combination thereof. In some embodiments, a first interfacial layer 104a is formed between the first dummy gate strip 106a and the first fin 102, a second interfacial layer 104b is formed between the second dummy gate strip 106b and the second fin 102b. In some embodiments, the first and second interfacial layers 104a and 104b include silicon oxide, silicon oxynitride or a combination thereof.

In some embodiments, the first and second spacers 108a and 108b have a dielectric constant less than about 10, less than about 7 or even less than about 5. In some embodiments, the first and second spacers 108a and 108b include a nitrogen-containing dielectric material, a carbon-containing dielectric material or both. In some embodiments, the spacers 108a include SiN, SiCN, SiOCN, SiC, SiOC, SiON, the like, or a combination thereof.

In some embodiments, the first strained layers 110a include silicon carbon (SiC), silicon phosphate (SiP), SiCP or a SiC/SiP multi-layer structure for an N-type FinFET device. In some embodiments, the first strained layers 110a may be optionally implanted with an N-type dopant as needed. In some embodiments, the second strained layers 110b include silicon germanium (SiGe) for a P-type FinFET device. In some embodiments, the second strained layers 110b may be optionally implanted with a P-type dopant as needed. In some embodiments, the first and second strained layers 110a and 110b can be referred to as "source/drain regions". In some embodiments, following the formation of the first and second strained layers 110a and 100b, first and second silicide layers are formed by siliciding the top portions of the first and second strained layers 110a and 110b.

Thereafter, a dielectric layer 114 is formed aside the first and second dummy gate strips 106a and 106b, and formed over the first and second strained layers 110a and 110b. In some embodiments, the dielectric layer 114 includes nitride such as silicon nitride, oxide such as silicon oxide, phosphosilicate glass (PSG), borosilicate glass (BSG), boron-doped phosphosilicate glass (BPSG), the like, or a combination thereof, and is formed by a suitable deposition technique such as spin-coating, CVD, flowable CVD, PECVD, ALD, the like, or a combination thereof. In some embodiments, an etch stop layer 112 is formed before the formation of the dielectric layer 114 and after the formation of the first and second strained layers 110a and 110b. In some embodiments, the etch stop layer 112 includes SiN, SiC, SiCN, SiON, SiCON, the like, or a combination thereof. In some embodiments, an etch stop material layer and a dielectric material layer are formed over the substrate 100 covering the first and second dummy gate strips 106a and 106b, and then planarized by a suitable technique such as CMP until the top surfaces of the first and second dummy gate strips 106a and 106b are exposed. In some embodiments, the top surfaces of the dielectric layer 114 and the etching stop layer 112 are substantially level with the top surfaces of the first and second dummy gate strips 106a and 106b.

Figure 1C:
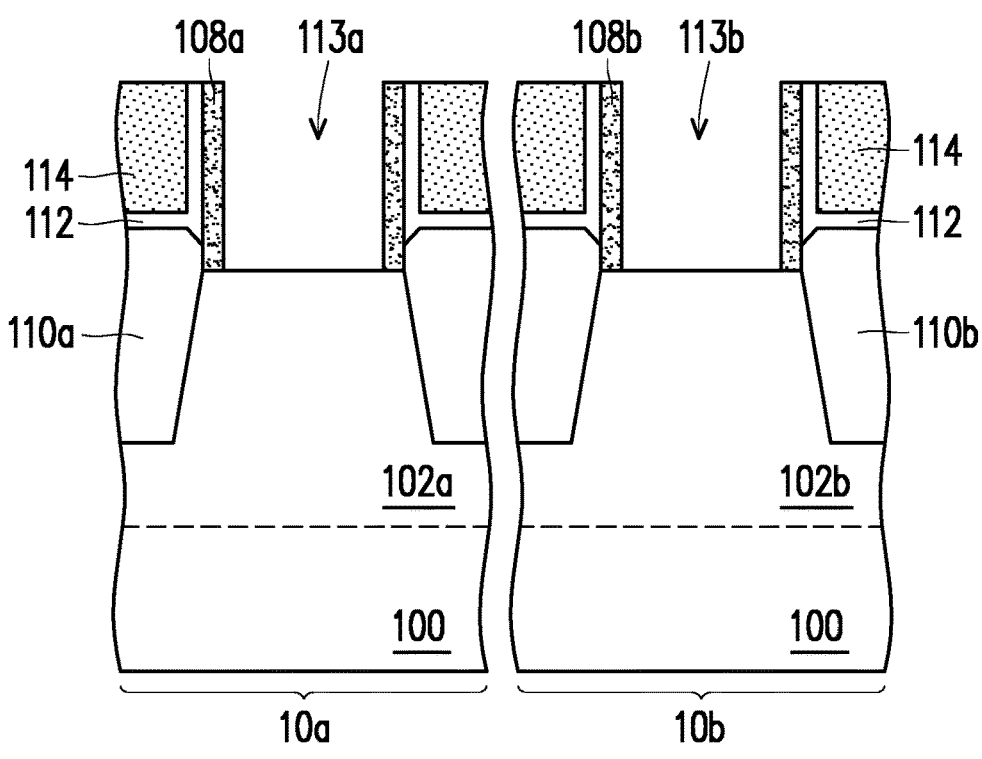

Referring to FIG. 1C, the first dummy gate strip 106a is removed to form a first trench 113a in the dielectric layer 114 in the first region 10a, and the second dummy gate strip 106b is removed to form a second trench 113b in the dielectric layer 114 in the second region 10b. In some embodiments, the first and second interfacial layers 104a and 104b are simultaneously removed during the removal of the first and second dummy gate strips 106a and 106b. The removing operation includes performing a suitable etching process, such as a dry etching, a wet etching or both.

Figure 1D:
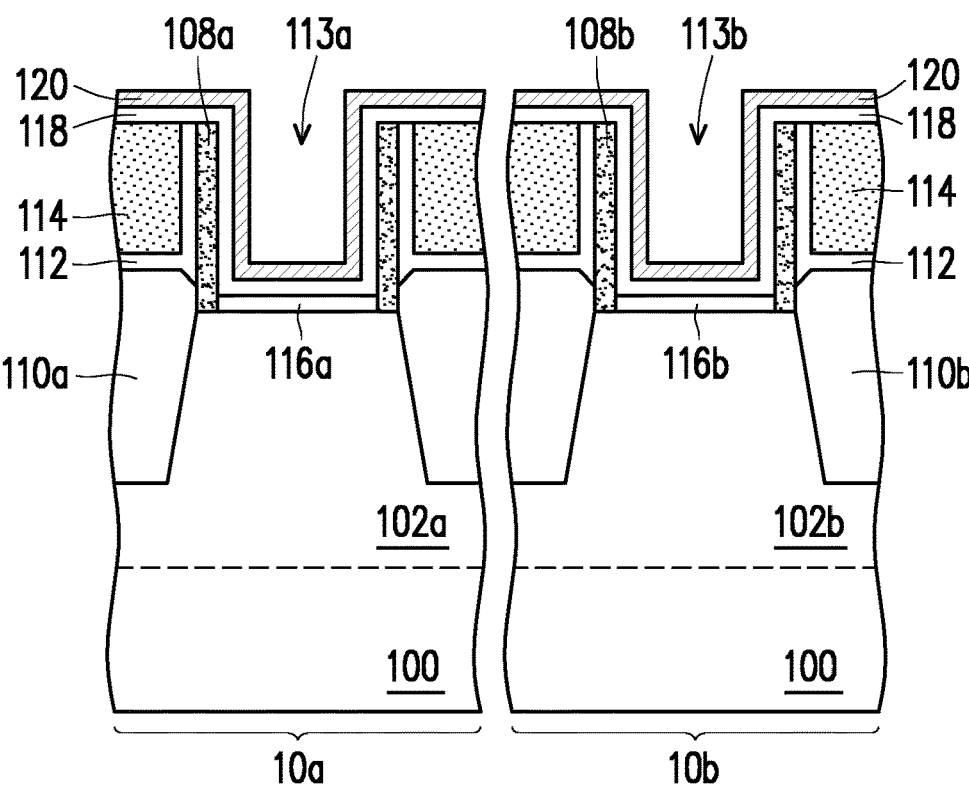

Referring to FIG. 1D, a first initial layer 116a is formed on the surface of the first fin 102, and a second initial layer 116b is formed on the surface of the second fin 102b. In some embodiments, the first and second initial layer 116a and 116b have a dielectric constant less than about 8, less than about 6 or even less than about 4. In some embodiments, the first and second initial layers 116a and 116b include silicon oxide, silicon oxynitride, the like, or a combination thereof. In some embodiments, when the first and second initial layer 116a and 116b are formed by using thermal oxidation, ozone oxidation or a suitable oxidation process, the first and second initial layers 116a and 116b are formed on the bottom surfaces of the first and second trenches 113a and 113b. In alternative embodiments, when the first and second initial layers 116a and 116b are formed by using CVD, ALD or a suitable deposition process, the first and second initial layers 116a and 116b are formed on the entire surfaces (e.g., side and bottom surfaces) of the first and second trenches 113a and 113b.

Thereafter, the high-k material layer 118 is blanket-formed on the substrate 100 in the first and second regions 10a and 10b. In some embodiments, the high-k material layer 118 is formed over the substrate 100 and fills in the first and second trenches 113a and 113b. Specifically, the high-k material layer 118 is conformally formed on the top surface of the dielectric layer 114, on the top surfaces of the first and second initial layers 116a and 116b and on the sidewalls of the first and second trenches 113a and 113b. In some embodiments, the high-k material layer 118 has a dielectric constant greater than that of the first and second initial layer 116a and 116b. For example, the high-k material layer 118 has a dielectric constant greater than about 12, greater than about 16 or even greater than about 20. In some embodiments, the high-k material layer 118 includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the high-k material layer 118 can optionally include a silicate such as HfSiO, HfSiON LaSiO, AlSiO, a combination thereof, or a suitable material. In some embodiments, the method of forming the high-k material layer 118 includes performing at least one suitable deposition technique, such as ALD, plasma enhance ALD (PEALD), CVD, plasma enhanced CVD (PECVD), the like, or a combination thereof.

Still referring to FIG. 1D, a P-type work function metal material layer 120 is blanket-formed on the high-k material layer 118 in the first and second regions 10a and 10b. In some embodiments, the P-type work function metal material layer 120 is conformally formed over the substrate 100 along the topography of the high-k material layer 118 in the first and second regions 10a and 10b, and fills in the first and second trenches 113a and 113b. In some embodiments, the P-type work function metal material layer 120 includes TiN, WN, TaN, the like, or a combination thereof. In some embodiments, the method of forming the P-type work function metal material layer 120 includes performing at least one suitable deposition technique, such as ALD, PEALD, CVD, PECVD, the like, or a combination thereof. In some embodiments, the P-type work function metal material layer 120 has a thickness ranging from about 1 angstrom to about 50 angstroms, such as about 5 angstroms to about 30 angstroms.

Figure 1E:
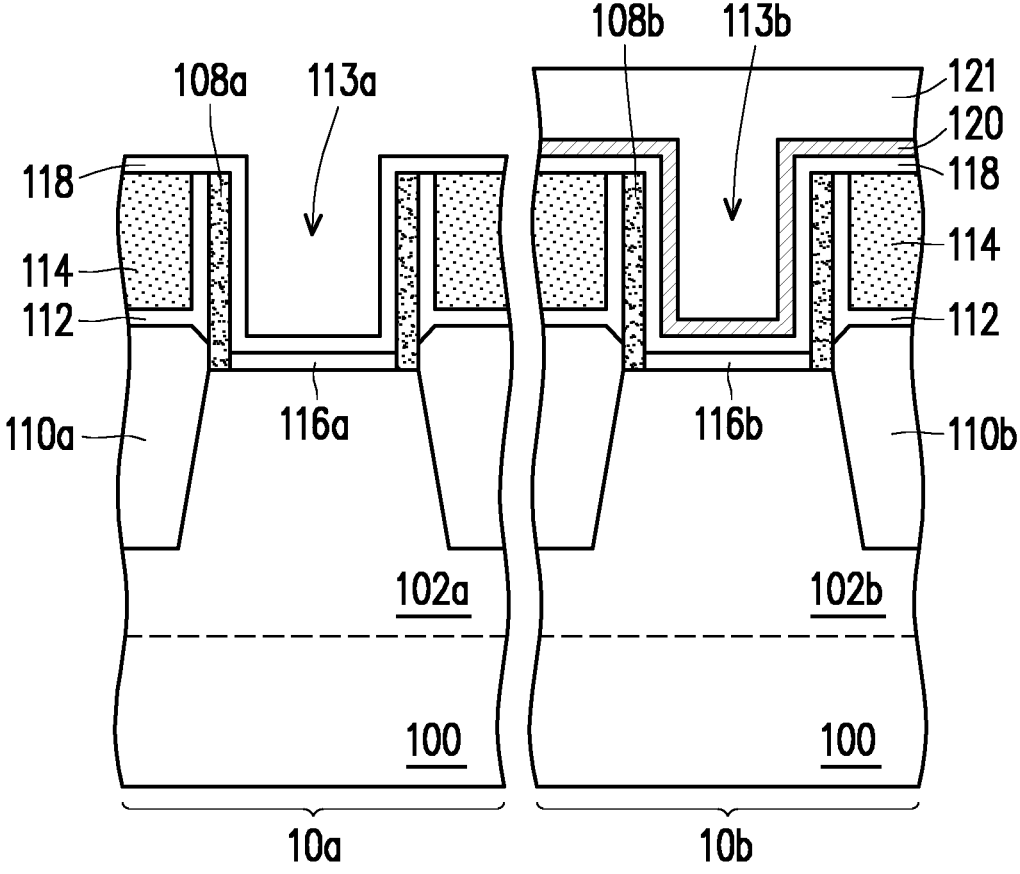

Referring to FIG. 1E, the P-type work function metal material layer 120 is removed from the first region 10a. In some embodiments, a mask layer 121 is formed on the substrate 100, covers the second region 10b and exposes the first region 10a. The mask layer 121 may include a photo-resist material, a dielectric material or both. Thereafter, a portion of the P-type work function metal material layer 120 is removed by using the mask layer 121 as a mask. The removing operation includes performing a suitable etching process, such as a dry etching, a wet etching or both. Upon the removing operation, the remaining P-type work function metal material layer 120 is provided in the second region 10b. In some embodiments, the P-type work function metal material layer 120 is in physical contact with the high-k material layer 118 in the second region 10b.

Figure 1F:
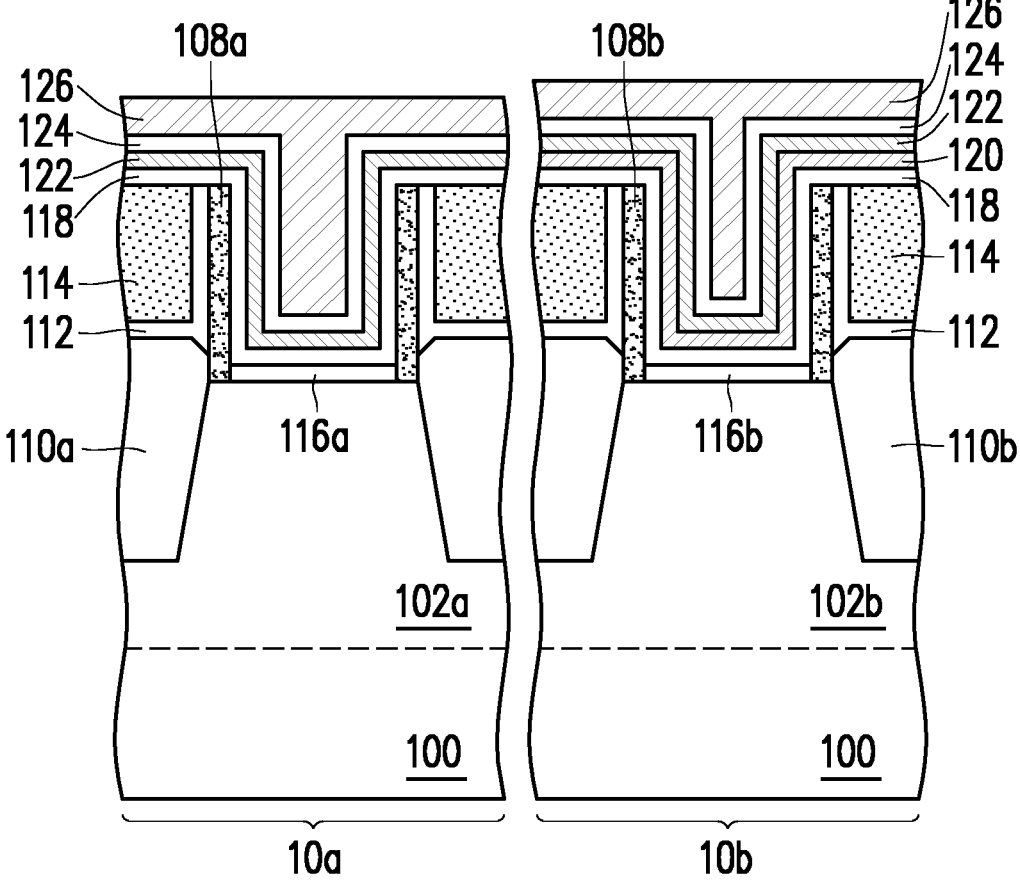

Referring to FIG. 1F, an N-type work function metal material layer 122 is blanket-formed on the substrate 100 in the first and second regions 10a and 10b. In some embodiments, the N-type work function metal material layer 122 is conformally formed over the substrate 100 along the topography of the high-k material layer 118 in the first region 10a and the topography of the P-type work function metal material layer 120 in the second region 10b, and fills in the first and second trenches 113a and 113b. In some embodiments, the N-type work function metal material layer 122 includes TiAl, TiAlC, TaAl, TaAlC, the like, or a combination thereof. In some embodiments, the method of forming the N-type work function metal material layer 122 includes performing at least one suitable deposition technique, such as ALD, PEALD, CVD, PECVD, the like, or a combination thereof. In some embodiments, the N-type work function metal material layer 122 has a thickness ranging from about 1 angstrom to about 50 angstroms, such as about 5 angstroms to about 30 angstroms.

Afterwards, a barrier material layer 124 is formed on the N-type work function metal material layer 122 in the first and second regions 10a and 10b. In some embodiments, the barrier material layer 124 is conformally formed over the substrate 100 along the topography of the N-type work function metal material layer 122 in the first and second regions 10a and 10b, and fills in the first and second trenches 113a and 113b.

In some embodiments, the barrier material layer 124 is configured to prevent oxide from entering the underlying N-type work function metal material layer 122 and reacting with aluminum in the N-type work function metal material layer 122. Such aluminum oxidation may degrade the performance of an N-type FinFET device. In some embodiments, the barrier material layer 124 contains TiAlN, TaAlN, AlN or a combination thereof. Specifically, the strong Al—N bonding in the barrier material layer 124 acts as a barrier to protect the underlying layer against oxidation.

In some embodiments, the barrier material layer 124 includes a material different from that of the N-type work function metal material layer 122. In some embodiments, the N-type work function metal material layer 122 includes TiAlC, and the barrier material layer 124 includes TiAlN. In some embodiments, the aluminum content of the barrier material layer 124 ranges from 10 at % to 90 at %, so as to function as an effective aluminum diffusion barrier. In some embodiments, the method of forming the barrier material layer 124 includes performing at least one suitable deposition technique, such as ALD, PEALD, CVD, PECVD, the like, or a combination thereof. In some embodiments, the barrier material layer 124 has a thickness ranging from about 1 angstrom to about 50 angstroms, such as about 5 angstroms to about 30 angstroms.

In some embodiments, when the barrier material layer 124 includes TiAlN, a titanium precursor, an aluminum precursor and a nitrogen precursor are introduced into a process chamber. The titanium precursor may include tetrakis(dimethylamino) titanium (TDMAT), tetrakis(diethylamino) titanium (TDEAT), titanium tetrachloride ($TiCl_4$), or a derivative thereof. The aluminum precursor may include tri(tertbutyl) aluminum (TTBA), tri(isopropyl) aluminum, triethylaluminum (TEA), trimethylaluminum (TMA), di(tertbutyl) aluminum hydride, di(isopropyl) aluminum hydride, diethylaluminum hydride, dimethylaluminum hydride, di(tertbutyl) aluminum chloride, di(isopropyl) aluminum chloride, diethylaluminum chloride, dimethylaluminum chloride, aluminum tertbutoxide, aluminum isopropoxide, aluminum triethoxide, aluminum trimethoxide, or a derivative thereof. The nitrogen precursor may include ammonia ($NH_3$), hydrazine ($N_2H_4$), methylhydrazine, dimethyl hydrazine, tertiarybutylhydrazine, phenylhydrazine, or a derivative thereof.

In alternative embodiments, when the barrier material layer 124 includes TaAlN, a titanium precursor, an aluminum precursor and a nitrogen precursor are introduced into a process chamber. The tantalum precursor may include pentakis(dimethylamido)tantalum (PDMAT), tris(ethylmethylamido) tert-butylimido tantalum(V) (TBTEMT), or derivative thereof. The aluminum precursor and the nitrogen precursor are similar to those described above, and the details are not iterated herein.

In other embodiments, when the barrier material layer 124 includes AlN, an aluminum precursor and a nitrogen precursor are into a process chamber. The aluminum precursor and the nitrogen precursor are similar to those described above, and the details are not iterated herein.

In some embodiments, impurities or trace elements other than Ti, Ta, Al and/or N elements are observed in the barrier material layer 124 due to the residual precursors. For example, these trace elements include C, O and/or Cl atoms, and the content of the trace elements is less than about 5 at %.

Each precursor pulse time may range from about 0.1 second to about 30 minutes, and each precursor flow may range from about 100 sccm to about 9,000 sccm. The chamber temperature may range from about 200° C. to about 600° C. The chamber pressure may range from about 0.5 torr to about 400 torr. In the case that the process chamber is an ALD chamber, the required precursors are sequentially introduced into the ALD chamber. For example, a titanium precursor, an aluminum precursor and a nitrogen precursor are sequentially introduced into an ALD process chamber to form a TiAlN film.

In the case that the chamber is a CVD chamber, the required precursors are simultaneously introduced into the CVD chamber. For example, a titanium precursor, an aluminum precursor and a nitrogen precursor are simultaneously introduced into a CVD process chamber to form a TiAlN film.

In some embodiments, the N-type work function metal material layer 122 and the barrier material layer 124 are formed in-situ in the same process chamber. However, the present disclosure is not limited thereto. In alternative embodiments, the N-type work function metal material layer 122 and the barrier material layer 124 are formed ex-situ in different process chambers.

The above embodiments in which the barrier material layer 124 is a single layer is provided for illustration purposes, and are not construed as limiting the present disclosure. In other embodiments, the barrier material layer 124 may have a multi-layer structure, which will be described in details in the following.

Upon the formation of the barrier material layer 124, a metal filling material layer 126 is formed over the substrate 100 and fills in the first and second trenches 113a and 113b. In some embodiments, the metal filling material layer 126 is configured to provide an electrical transmission. In some embodiments, the metal filling material layer 126 is formed on the barrier material layer 122 and completely fills the first and second trenches 113a and 113b. In some embodiments, the metal filling material layer 126 is formed directly on the barrier material layer 124. In some embodiments, the metal filling material layer 126 includes W, Al, Cu, the like, or a combination thereof. In some embodiments, the method of forming the metal filling material layer 126 includes performing at least one suitable deposition technique, such as ALD, PEALD, CVD, PECVD, the like, or a combination thereof. In some embodiments, the metal filling material layer 126 has a thickness ranging from about 50 angstroms to about 3,000 angstroms.

Figure 1G:
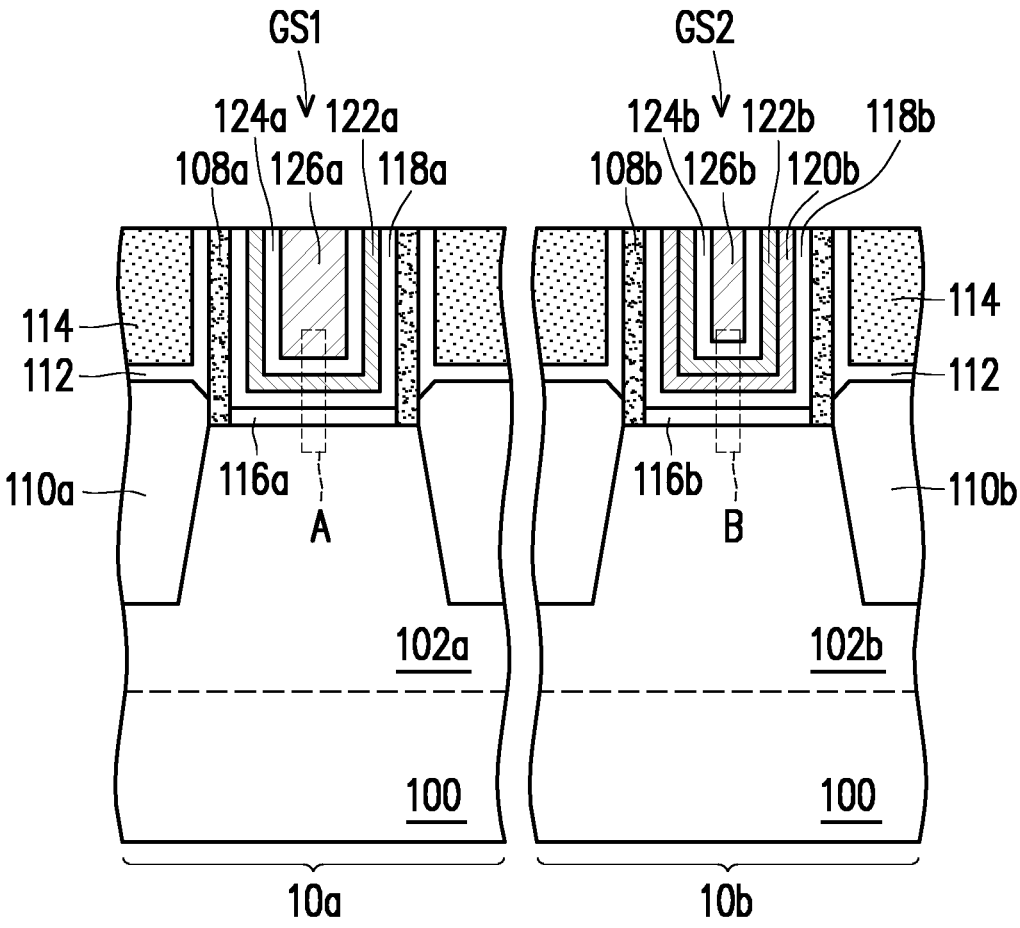

Referring to FIG. 1G, excess layers outside of the first and second trenches 113a and 113b are removed, and the remaining layers form a first gate strip GS1 in the first trench 113a and a second gate strip GS2 in the second trench 113b. In some embodiments, portions of the metal filling material layer 126, the barrier material layer 124, the N-type work function metal material layer 122, the P-type work function metal material layer 120 and the high-k material layer 118 outside of the first and second trenches 113a and 113b are removed by a planarization operation such as CMP, and the remaining layers constitute the first and second gate strips GS1 and GS2 in the first and second regions 10a and 10b. In some embodiments, as shown in the enlarged and local view of FIG. 1H, the first gate strip GS1 in the first region 10a includes, from bottom to top, a first initial layer 116a, a first high-k layer 118a, a first N-type work function metal layer 122a, a first barrier layer 124a and a first metal filling layer 126a. Similarly, the second gate strip GS2 in the second region 10b includes, from bottom to top, a second initial layer 116b, a second high-k layer 118b, a P-type work function metal layer 120b, a second N-type work function metal layer 122b, a second barrier layer 124b and a second metal filling layer 126b. A FinFET device of the disclosure is thus completed.

In the FinFET device of the disclosure, the barrier layer acts as an aluminum diffusion barrier and plays a role to prevent aluminum oxidation. By such disposition, in the N-type FinFET device of disclosure, the metallic-Al can keep rich and shift the feedback voltage $V_{FB}$ towards n-band edge, and therefore reduce the threshold voltage $V_{TH}$. Besides, the barrier layer also acts as an adhesion layer, so the metal filling layer can grow directly on the surface thereof. Accordingly, the conventional TiN glue layer between the N-type work function metal layer and the metal filling layer may be omitted and therefore enlarge the metal-gate fill window.

In the above embodiments, the method of the disclosure is applied to a FinFET device. However, the disclosure is not limited thereto. In some embodiments, the gate strips of the disclosure can be applied to a planar device upon the process requirements. Specifically, a planar substrate without fins is provided instead of the substrate 100 with fins, and such planar substrate is subjected to the process operations similar to those described above, so as to fabricate a planar device with a barrier layer between an N-type work function metal layer and a metal filling layer. In other embodiments, the gate strips of the disclosure can be applied to a gate-all-around (GAA) device upon the process requirements. Specifically, a substrate with nanowires is provided instead of the substrate 100 with fins, and such substrate with nanowires is subjected to the process operations similar to those described above, so as to fabricate a GAA device with a barrier layer between an N-type work function metal layer and a metal filling layer. In a GAA device, the gate strips of the disclosure are formed to surround the nanowires.

Possible modifications and alterations can be made to the FinFET device. These modifications and alterations are provided for illustration purposes, and are not construed as limiting the present disclosure. FIG. 2 to FIG. 5 are local cross-sectional views of various FinFET devices in accordance with alternative embodiments. In FIG. 2 to FIG. 5, only gate strips are illustrated for simplicity and clarity. The gate strips of FIG. 2 to FIG. 5 are similar to the gate strips of FIG. 1H, so the difference between them is illustrated in details below, and the similarity is not iterated herein. In some embodiments, the gate strips of FIG. 2 to FIG. 5 can be applied to the FinFET device of FIG. 1G. However, the disclosure is not limited thereto. In some embodiments, the gate strips of the disclosure can be applied to a planar device or a GAA device upon the process requirements.

Figure 1H:
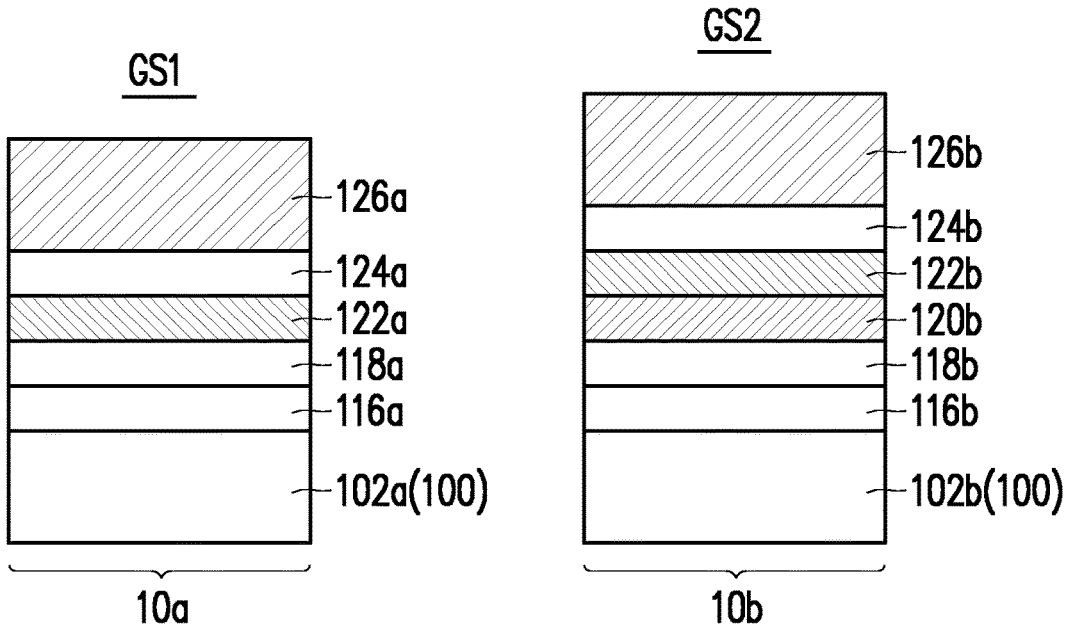
FIG. 1H is an enlarged local view of regions A and B of FIG. 1G in accordance with some embodiments.
Figure 2:
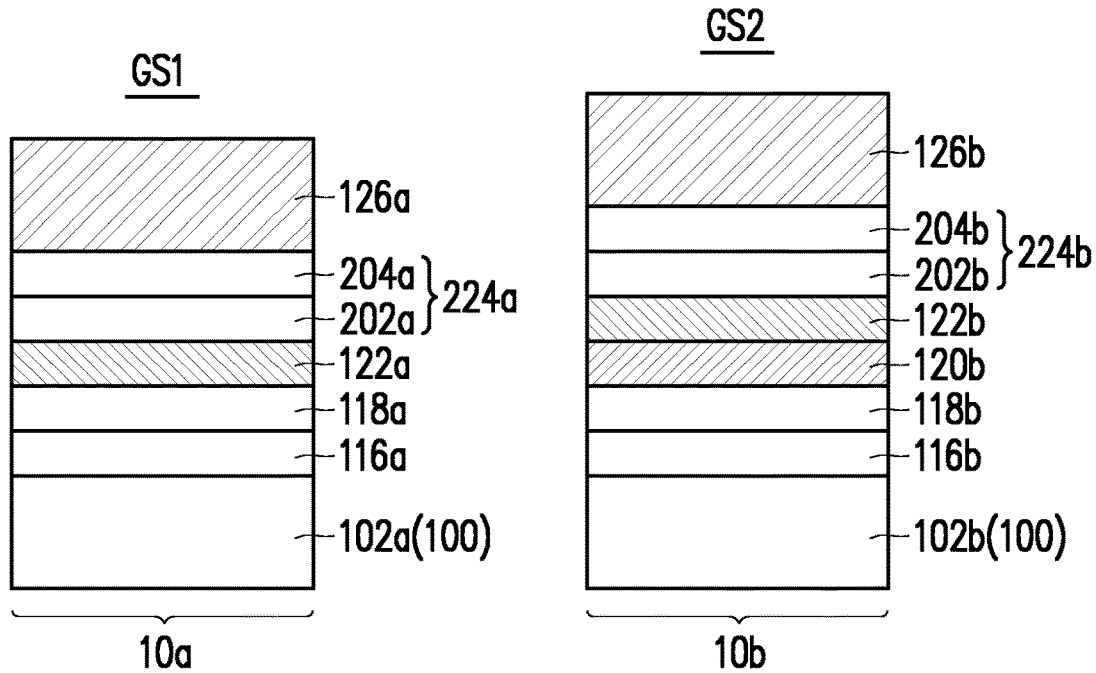
FIG. 2 to FIG. 5 are local cross-sectional views of various FinFET devices in accordance with alternative embodiments.

The gate strips of FIG. 2 are similar to the gate strips of FIG. 1H, and the difference between them lies in that, each of the first and second barrier layers 124a and 124b of FIG. 1H is a single layer, while each the first and second barrier layers 224a and 224b of FIG. 2 is a dual-layer structure. Specifically, in FIG. 2, the first barrier layer 224a includes a lower barrier layer 202a and an upper barrier layer 204a, and the second barrier layer 224b includes a lower film 202b and an upper film 204b. In some embodiments, the lower films 202a and 202b include TiN, and the upper films 204a and 204b include TiAlN, TaAlN or AlN. However, the disclosure is not limited thereto. In alternative embodiments, the lower films 202a and 202b include TiAlN, TaAlN or AlN, and the upper films 204a and 204b include TiN. In some embodiments, each of the lower and upper films has a thickness ranging from about 1 angstrom to about 25 angstroms.

In some embodiments, the method of forming the first and second barrier layers 224a and 224b includes: (a) sequentially introducing a titanium precursor, an aluminum precursor and a nitrogen precursor into a process chamber to form a TiAlN film; and (b) sequentially introducing the titanium precursor and the nitrogen precursor into the process chamber to form a TiN film. Upon the process requirements, the sequence of step (a) and step (b) can be exchanged as needed and the precursors of step (a) and step (b) can be adjusted as desired, as long as each of the first and second barrier layers 224a and 224b includes at least one film containing TiAlN, TaAlN or AlN. In some embodiments, such Al—N bond-containing film is in contact with the overlying metal filling layer, so as to effectively prevent aluminum oxidation of the underlying N-type work function metal layer. However, the disclosure is not limited thereto. In alternative embodiments, such Al—N bond-containing film is disposed over and in contact with the underlying N-type work function metal layer.

Figure 3:
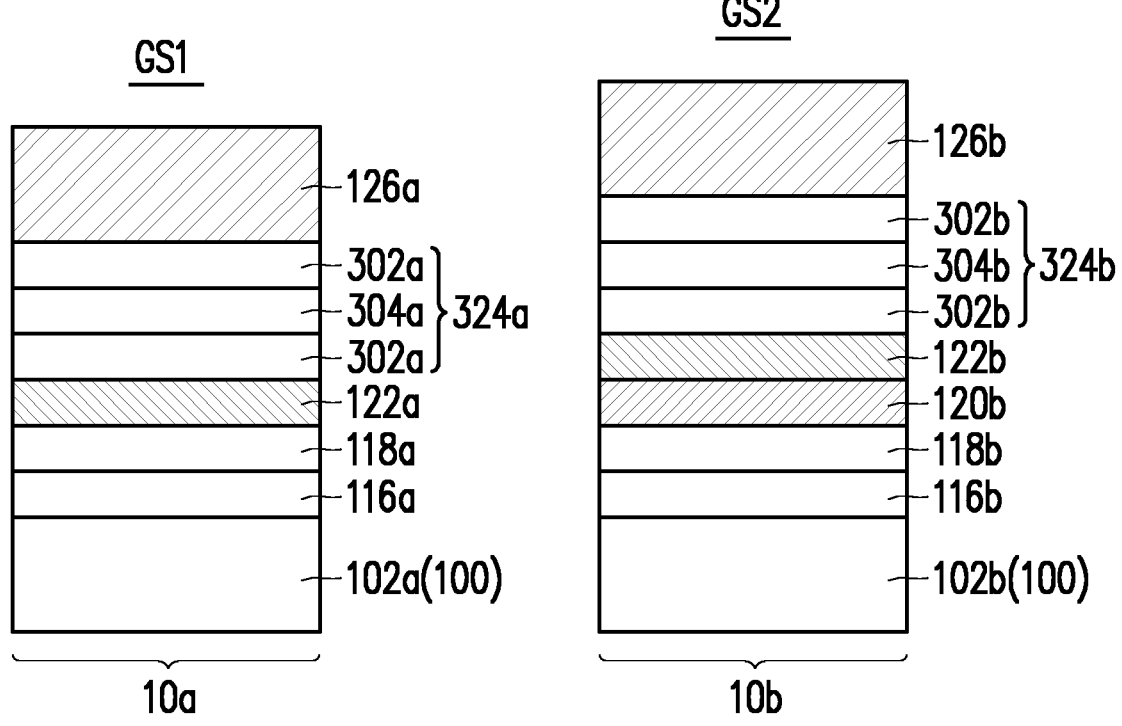

The gate strips of FIG. 3 are similar to the gate strips of FIG. 1H, and the difference between them lies in that, each of the first and second barrier layers 124a and 124b of FIG. 1H is a single layer, while each the first and second barrier layers 324a and 224b of FIG. 3 is a tri-layer structure. Specifically, in FIG. 3, the first barrier layer 324a includes two outer films 302a and an inner film 304a sandwiched between the outer films 302a, and the first barrier layer 324b includes two outer films 302b and an inner film 304b sandwiched between the outer films 302b. In some embodiments, the outer films 302a and 302b include TiAlN, TaAlN or AlN, and the inner films 304a and 304b include TiN. However, the disclosure is not limited thereto. In alternative embodiments, the outer films 302a and 302b include TiN, and the inner films 304a and 304b include TiAlN, TaAlN or AlN. In some embodiments, each of the outer and inner films has a thickness ranging from about 1 angstrom to about 10 angstroms.

In some embodiments, the method of forming the first and second barrier layers 324a and 324b includes: (a) sequentially introducing a titanium precursor, an aluminum precursor and a nitrogen precursor into a process chamber to form a TiAlN film; (b) sequentially introducing the titanium precursor and the nitrogen precursor into the process chamber to form a TiN film; and (c) repeating step (a) to form another TiAlN film. Upon the process requirements, the sequence of step (a) and step (b) can be exchanged as needed and the precursors of step (a) and step (b) can be adjusted as desired, as long as each of the first and second barrier layers 324a and 324b includes at least one film containing TiAlN, TaAlN or AlN. In some embodiments, such Al—N bond-containing films are in contact with both the overlying metal filling layer and the underlying N-type work function metal layer, so as to effectively prevent aluminum oxidation of the underlying N-type work function metal layer. However, the disclosure is not limited thereto. In alternative embodiments, such Al—N bond-containing film is disposed between but separated from both the overlying metal filling layer and the underlying N-type work function metal layer.

Figure 4:
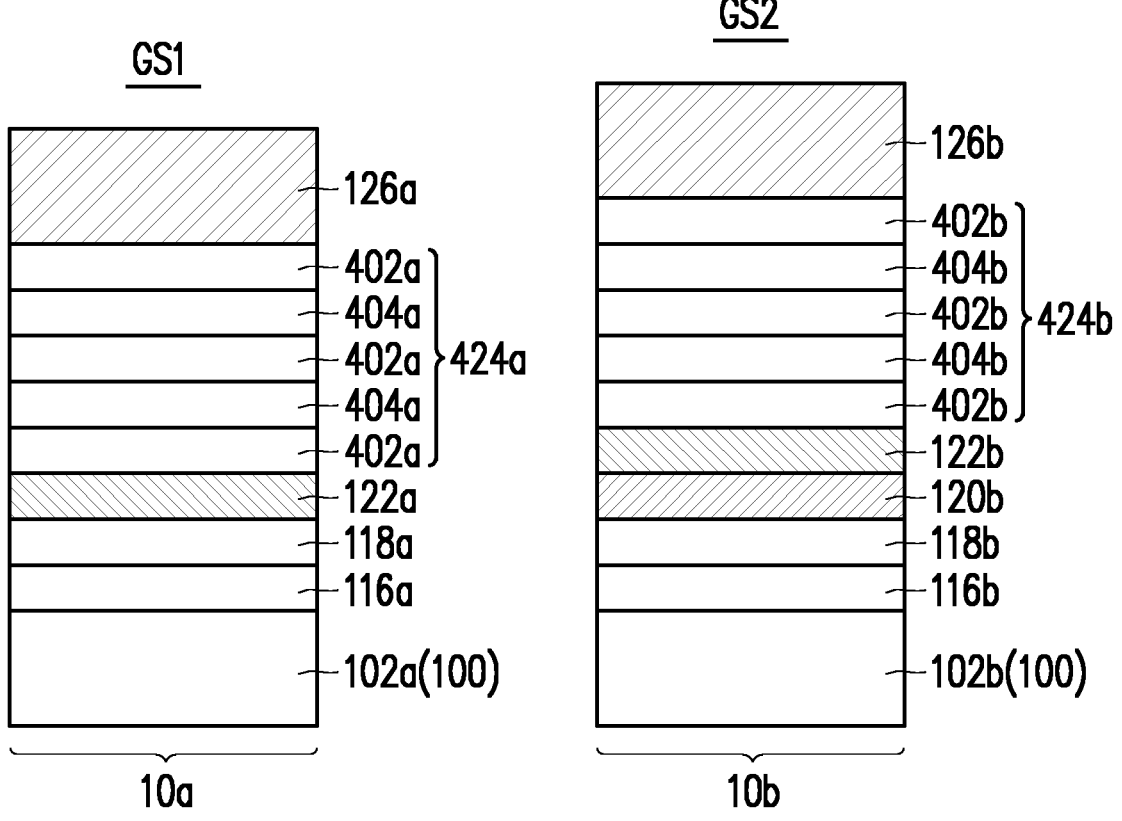

The gate strips of FIG. 4 are similar to the gate strips of FIG. 1H, and the difference between them lies in that, each of the first and second barrier layers 124a and 124b of FIG. 1H is a single layer, while each the first and second barrier layers 424a and 424b of FIG. 4 is a laminated structure. Specifically, in FIG. 4, the first barrier layer 424a includes first films 402a and second films 404a stacked alternately, and the second barrier layer 424b includes first films 402b and second films 404b stacked alternately. In some embodiments, the first films 402a and 402b include TiAlN, TaAlN or AlN, and the second films 404a and 404b include TiN. However, the disclosure is not limited thereto. In alternative embodiments, the first films 402a and 402b include TiN, and the second films 404a and 404b include TiAlN, TaAlN or AlN. In some embodiments, each of the first and second films has a thickness ranging from about 1 angstrom to about 10 angstroms.

In some embodiments, the method of forming the first and second barrier layers 424a and 424b includes: (a) sequentially introducing a titanium precursor, an aluminum precursor and a nitrogen precursor into a process chamber to form a TiAlN film; (b) sequentially introducing the titanium precursor and the nitrogen precursor into the process chamber to form a TiN film; and (c) repeating step (a) and step (b) alternately m times, wherein m is an integer between 1 and 5.

Upon the process requirements, the sequence of step (a) and step (b) can be exchanged as needed and the precursors of step (a) and step (b) can be adjusted as desired, as long as each of the first and second barrier layers 424a and 424b includes at least one film containing TiAlN, TaAlN or AlN. In some embodiments, step (a) is last performed in the repeating step, and one Al—N bond-containing film is disposed below and in contact with the overlying metal filling layer, so as to effectively prevent aluminum oxidation of the underlying N-type work function metal layer. In some embodiments, step (a) is first performed in the repeating step, and one Al—N bond-containing film is disposed over and in contact with the underlying N-type work function metal layer.

Figure 5:
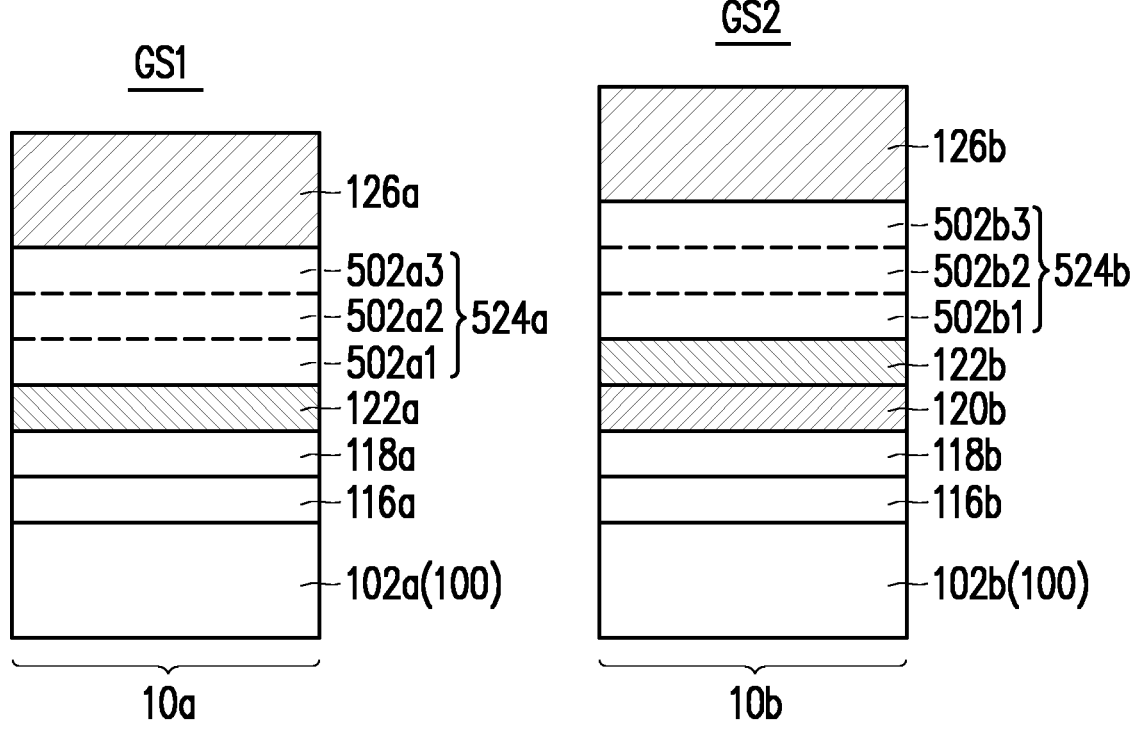

The gate strips of FIG. 5 are similar to the gate strips of FIG. 1H, and the difference between them lies in that, the aluminum content of each of the first and second barrier layers 124a and 124b of FIG. 1H keeps substantially constant, while the aluminum content of each the first and second barrier layers 524a and 524b of FIG. 5 is varied. Specifically, in FIG. 5, the aluminum content of each the first and second barrier layers 524a and 524b is increased away from the first and second N-type work function metal layers 122a and 122b. Specifically, in FIG. 5, the first barrier layer 524a includes, from bottom to top, films 502a1, 502a2 and 502a3, and the second barrier layer 524b includes, from bottom to top, films 502b1, 502b2 and 502b3. In some embodiments, the films 502a1, 502a2, 502a3, 502b1, 502b2 and 502b3 include TiAlN, TaAlN or AlN. In some embodiments, the average aluminum content of the film 502a3 is greater than the average aluminum content of the film 502a2, and the average aluminum content of the film 502a2 is greater than the average aluminum content of the film 502a1. Similarly, the average aluminum content of the film 502b3 is greater than the average aluminum content of the film 502b2, and the average aluminum content of the film 502b2 is greater than the average aluminum content of the film 502b1. Such disposition is beneficial to effectively prevent aluminum oxidation of the underlying N-type work function metal layer. However, the disclosure is not limited thereto. In alternative embodiments, the aluminum content of each the first and second barrier layers 524a and 524b can be gradually increased toward the first and second N-type work function metal layers 122a and 122b as needed. In some embodiments, each of the films has a thickness ranging from about 1 angstrom to about 10 angstroms.

The structures of the disclosure are described with reference to FIG. 1G to FIG. 1H and FIG. 2 to FIG. 5 in the following.

In some embodiments, a semiconductor device such as a FinFET device includes a substrate 100 and a gate strip GS1/GS2. The gate strip GS1/GS2 is disposed over the substrate 100 and includes a high-k layer 118a/118b, an N-type work function metal layer 122a/122b, a barrier layer 124a/124b (or 224a/224b, 324a/324b, 424a/424b, 524a/

524*b*), and a metal filling layer 126*a*/126*b*. The high-k layer 118*a*/118*b* is disposed over the substrate 100. The N-type work function metal layer 122*a*/122*b* is disposed over the high-k layer 118*a*/118*b*. The barrier layer 124*a*/124*b* (or 224*a*/224*b*, 324*a*/324*b*, 424*a*/424*b*, 524*a*/524*b*) is disposed over the N-type work function metal layer 122*a*/122*b* and includes at least one first film containing TiAlN, TaAlN or AlN. In some embodiments, the aluminum content of the first film ranges from about 10 at % to about 90 at %, such as from about 20 at % to about 40 at %, or from about 30 at % to about 50 at %.

In some embodiments, as shown in FIG. 1H, the barrier layer 124*a*/124*b* includes a single first film that is in physical contact with the N-type work function metal layer 122*a*/122*b* and the metal filling layer 126*a*/126*b*.

In some embodiments, as shown in FIG. 2, the barrier layer 224*a*/224*b* includes a first film (e.g., film 204*a*/204*b*) and a second film (e.g., film 202*a*/202*b*) stacked below the first film, the first film contains TiAlN, TaAlN or AlN, and the second film contains TiN. In some embodiments, as shown in FIG. 2, the first film (e.g., film 204*a*/204*b*) is in physical contact with the metal filling layer 126*a*/126*b*.

In some embodiments, as shown in FIG. 3, the barrier layer 324*a* includes two first films (e.g., films 302*a*) and a second film (e.g., film 304*a*) between the first films, and the barrier layer 324*b* includes two first films (e.g., films 302*b*) and a second film (e.g., film 304*b*) between the first films. The first films contain TiAlN, TaAlN or AlN, and the second films contain TiN. In some embodiments, as shown in FIG. 3, two first films (e.g., films 302*a*/302*b*) of the barrier layer 324*a*/324*b* are in physical contact with the N-type work function metal layer 122*a*/122*b* and the metal filling layer 126*a*/126*b*, respectively.

In some embodiments, as shown in FIG. 4, the barrier layer 424*a*/424*b* includes a plurality of first films (e.g., films 402*a*/402*b*) and a plurality of second films (e.g., films 404*a*/404*b*) alternately stacked, the first films contain TiAlN, TaAlN or AlN, and the second films contain TiN. In some embodiments, as shown in FIG. 4, two first films (e.g., films 402*a*/402*b*) of the barrier layer 424*a*/424*b* are in physical contact with the N-type work function metal layer 122*a*/122*b* and the metal filling layer 126*a*/126*b*, respectively.

In some embodiments, the aluminum content of the first film(s) keeps substantially constant. However, the disclosure is not limited thereto. In some embodiments, the aluminum content of the first film(s) is varied. For example, the aluminum content of the first film(s) is increased away from the N-type work function metal layer 122*a*/122*b*.

In some embodiments, as shown in FIG. 5, the barrier layer 524*a* includes three first films (e.g., films 502*a*1-502*a*3, films 502*b*1-502*b*3), and the first films contain TiAlN, TaAlN or AlN. In some embodiments, the aluminum contents of the first films are increased away from the N-type work function metal layer. In some embodiments, as shown in FIG. 5, one first film (e.g., film 502*a*1/502*b*1) of the barrier layer 524*a*/524*b* is in physical contact with the N-type work function metal layer 122*a*/122*b*, and another first film (e.g., film 502*a*3/502*b*3) of the barrier layer 524*a*/524*b* is in physical contact with the metal filling layer 126*a*/126*b*, respectively.

In some embodiments, as shown in the second region 10*b* of FIG. 1H and FIG. 2 to FIG. 5, the gate strip GS2 further includes a P-type work function metal layer 120*b* between the N-type work function metal layer 122*b* and the high-k layer 118*b*.

In some embodiments, as shown in the first region 10*a* of FIG. 1H and FIG. 5, the gate strip GS1 is free of titanium nitride. That is, by disposing the barrier layer of disclosure, the conventional TiN layer between N-type work function metal layer and the metal filling layer is not required.

In alternative embodiments, the gate strip of the disclosure further includes titanium nitride as needed, as shown in the first region 10*a* of FIG. 2 to FIG. 4 and the second region 10*b* of FIG. 1H and FIG. 2 to FIG. 5.

In view of the above, in some embodiments, a barrier layer is introduced between an N-type work function metal layer and a metal filling layer, so as to protect the underlying N-type work function metal layer from aluminum oxidation which reduces the threshold voltage V of an N-type FinFET device. By disposing the barrier layer of the disclosure, the operation of forming the conventional TiN layer between the N-type work function metal layer and the metal filling layer may be omitted and therefore enlarge the metal-gate fill window.

In accordance with some embodiments of the present disclosure, a semiconductor device includes a substrate and a gate strip disposed over the substrate. The gate strip includes a high-k layer disposed over the substrate, an N-type work function metal layer disposed over the high-k layer, and a barrier layer disposed over the N-type work function metal layer. The barrier layer includes at least one first film containing TiAlN, TaAlN or AlN.

In accordance with alternative embodiments of the present disclosure, a FinFET device includes a substrate, a first gate strip and a second gate strip. The substrate has at least one first fin in a first region and at least one second fin in a second region. The first gate strip is disposed across the at least one first fin and includes a first high-k layer disposed over the first fin, a first N-type work function metal layer disposed over the first high-k layer, and a first TiAlN film disposed over the first N-type work function metal layer. The second gate strip is disposed across the at least one second fin and includes a second high-k layer disposed over the second fin, a P-type work function metal layer disposed over the second high-k layer, a second N-type work function metal layer disposed over the P-type work function layer, and a second TiAlN film disposed over the second N-type work function metal layer.

In accordance with yet alternative embodiments of the present disclosure, a method of forming a FinFET device including the following operations. A substrate is provided. The substrate has at least one first fin in a first region and at least one second fin in a second region. First and second dummy gate strips are formed across the first and the second fins, and a dielectric layer is formed aside the first and second dummy gate strips. The first and second dummy gate strips are removed to form first and second gate trenches in the dielectric layer. A high-k material layer is formed on surfaces of the first and second gate trenches in the first and second regions. A P-type work function metal material layer is formed on the high-k material layer in the first and second regions. The P-type work function metal material layer is removed from the first region. An N-type work function metal material layer is formed in the first and second regions. A barrier material layer is formed on the N-type work function metal material layer in the first and second regions, wherein a method of forming the barrier material layer includes (a) sequentially introducing a titanium precursor, an aluminum precursor and a nitrogen precursor into a process chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate; and
a gate stack disposed over the substrate and comprising:
a gate dielectric layer disposed over the substrate;
an N-type work function metal layer disposed over the gate dielectric layer; and
a multi-layer barrier structure disposed over the N-type work function metal layer and comprising first films and second films alternately stacked, wherein at least two of the first films comprise TiAlN, TaAlN or AlN and further comprise oxygen atoms.

2. The semiconductor device of claim 1, further comprising a metal filling layer disposed over the multi-layer barrier structure, wherein the bottommost first film is in contact with the N-type work function metal layer, and the topmost first film is in contact with the metal filling layer.

3. The semiconductor device of claim 2, wherein the metal filling layer comprises W, Al, Cu, or a combination thereof.

4. The semiconductor device of claim 1, wherein the first films of the multi-layer barrier structure have a gradient aluminum content gradually increased toward the N-type work function metal layer.

5. The semiconductor device of claim 1, wherein the second films comprise TiN.

6. The semiconductor device of claim 1, wherein the adjacent first and second films are in contact with each other.

7. The semiconductor device of claim 1, wherein the gate stack further comprises a P-type work function metal layer disposed between the N-type work function metal layer and the gate dielectric layer.

8. The semiconductor device of claim 1, wherein each of the first and second films of the multi-layer barrier structure has a thickness ranging from about 1 angstrom to about 25 angstroms.

9. The semiconductor device of claim 1, wherein the bottommost second film comprises TiN and is in contact with the N-type work function metal layer.

10. A semiconductor device, comprising:
a substrate having a first region and a second region;
a first gate stack disposed over the substrate in the first region and comprising:
a first gate dielectric layer disposed over the substrate;
a P-type work function metal layer disposed over the first gate dielectric layer; and
a plurality of first aluminum-containing barrier layers and at least one first aluminum-free barrier layer disposed over the P-type work function metal layer; and a second gate stack disposed over the substrate in the second region and comprising:
a second gate dielectric layer disposed over the substrate;
a N-type work function metal layer disposed over the second gate dielectric layer, wherein at least two of the first aluminum-containing barrier layers respectively comprise TiAlN, TaAlN or AlN and further comprise oxygen atoms.

11. The semiconductor device of claim 10, wherein a content of the oxygen atoms of the first aluminum-containing barrier layers is less than about 5 at %.

12. The semiconductor device of claim 10, wherein one of the first aluminum-containing barrier layers is further disposed on and in contact with the N-type work function metal layer.

13. The semiconductor device of claim 10, wherein the at least two of the first aluminum-containing barrier layers are in contact with the at least one aluminum-free barrier layer, and the at least two of the first aluminum-containing barrier layers have different aluminum contents.

14. The semiconductor device of claim 10, wherein the second gate stack further comprises a second aluminum-containing barrier layer and a second aluminum-free barrier layer disposed over the N-type work function metal layer and in contact with each other, wherein the second aluminum-containing barrier layer is in contact with the N-type work function metal layer.

15. The semiconductor device of claim 14, wherein the at least one second aluminum-containing barrier layer comprises TiAlN, TaAlN or AlN.

16. The semiconductor device of claim 14, wherein the at least one second aluminum-free barrier layer comprises TiN.

17. A semiconductor device, comprising:
a substrate; and
a gate stack disposed over the substrate and comprising:
a gate dielectric layer disposed over the substrate;
a P-type work function metal layer disposed over the gate dielectric layer;
an N-type work function metal layer disposed over the P-type work function metal layer; and
a first aluminum-containing barrier layer disposed over the N-type work function metal layer, wherein the first aluminum-containing barrier layer is physically separated from the N-type work function metal layer, and the first aluminum-containing barrier layer comprises TiAlN, TaAlN or AlN and further comprises oxygen atoms.

18. The semiconductor device of claim 17, further comprising a second aluminum-containing barrier layer disposed between the first aluminum-containing barrier layer and the N-type work function metal layer.

19. The semiconductor device of claim 18, further comprising a first aluminum-free barrier layer disposed between and in contact with the first aluminum-containing barrier layer and the second aluminum-containing barrier layer.

20. The semiconductor device of claim 17, further comprising a first aluminum-free barrier layer disposed between the first aluminum-containing barrier layer and the N-type work function metal layer.

* * * * *